(12) United States Patent
Yamashita et al.

(10) Patent No.: US 7,394,663 B2
(45) Date of Patent: Jul. 1, 2008

(54) ELECTRONIC COMPONENT BUILT-IN MODULE AND METHOD OF MANUFACTURING THE SAME

(75) Inventors: Yoshihisa Yamashita, Kyoto (JP);
 Koichi Hirano, Hirakata (JP); Yasuhiro Sugaya, Toyonaka (JP); Toshiyuki Asahi, Osaka (JP); Seiichi Nakatani, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 362 days.

(21) Appl. No.: 10/775,656

(22) Filed: Feb. 9, 2004

(65) Prior Publication Data

US 2004/0160752 A1    Aug. 19, 2004

(30) Foreign Application Priority Data

Feb. 18, 2003  (JP)  ............................. 2003-040172

(51) Int. Cl.
 *H05K 1/16* (2006.01)
(52) U.S. Cl. ..................... 361/766; 361/763; 361/803
(58) Field of Classification Search ......... 174/255–258; 361/760–766, 792–795; 257/678–704; 428/209–210
 See application file for complete search history.

(56) References Cited

U.S. PATENT DOCUMENTS

| | | | | |
|---|---|---|---|---|
| 5,172,304 A * | 12/1992 | Ozawa et al. | ............... | 361/763 |
| 5,401,688 A * | 3/1995 | Yamaji et al. | ............... | 156/196 |
| 5,484,647 A * | 1/1996 | Nakatani et al. | ............ | 428/209 |
| 6,038,133 A * | 3/2000 | Nakatani et al. | ............ | 361/760 |
| 6,359,235 B1 * | 3/2002 | Hayashi | ....................... | 174/260 |
| 6,566,422 B1 * | 5/2003 | Yagi et al. | .................... | 523/440 |
| 6,734,542 B2 * | 5/2004 | Nakatani et al. | ............ | 257/687 |
| 6,855,892 B2 * | 2/2005 | Komatsu et al. | ............ | 174/256 |
| 6,958,535 B2 * | 10/2005 | Hirano et al. | ................ | 257/707 |
| 2002/0117743 A1 | 8/2002 | Nakatani et al. | | |

FOREIGN PATENT DOCUMENTS

| | | |
|---|---|---|
| JP | 3-69191 | 3/1991 |
| JP | 8-222656 | 8/1996 |
| JP | 11-103147 | 4/1999 |
| JP | 11-220262 | 9/1999 |
| JP | 3062413 | 4/2000 |

OTHER PUBLICATIONS

Arlon, Measuring and Understanding Tg (Glass Transition Temperature).*

* cited by examiner

*Primary Examiner*—Tuan T Dinh
(74) *Attorney, Agent, or Firm*—Hamre, Schumann, Mueller & Larson, P.C.

(57) ABSTRACT

An electronic component built-in module according to the present invention includes a pair of opposed circuit substrates, each of which includes a wiring pattern and an insulating base material containing a resin, an insulating layer that is placed between the pair of circuit substrates and contains an inorganic filler and a resin composition containing a thermosetting resin, an electronic component that is embedded in the insulating layer, and an inner via that is provided in the insulating layer so as to make an electrical connection between wiring patterns provided on different circuit substrates. A glass transition temperature Tg1 of the resin composition contained in the insulating layer and a glass transition temperature Tg2 of the insulating base material included in each of the circuit substrates satisfy a relationship $Tg1 > Tg2$.

15 Claims, 10 Drawing Sheets

ELECTRONIC COMPONENT BUILT-IN MODULE AND METHOD OF MANUFACTURING THE SAME

BACKGROUND OF THE INVENTION

1. Field of the Invention

The present invention relates to an electronic component built-in module that houses electronic components including, for example, an active component such as a transistor or the like and a passive component such as a capacitor or the like, and a method of manufacturing the electronic component built-in module.

2. Related Background Art

In recent years, it has been requested that electronic equipment be capable of high performance and reduced in size. This has led to a demand for higher-density mounting and higher performance of electronic components. With this as a background, there also has been a demand for a small-sized circuit substrate on which electronic components can be mounted with high density. With respect to these demands, as a circuit substrate that allows high-density mounting, a multilayer circuit substrate in which wires formed on different layers are connected electrically by an inner via has been under development. By the use of a multilayer circuit substrate, wire connections between electronic components can be shortened, thereby allowing high-density wiring to be realized. However, even in a multilayer circuit substrate that allows high-density wiring as described above, electronic components mounted on a surface of the circuit substrate still constitute a large portion of the multilayer circuit substrate, which has been a hindrance to a reduction in size.

With respect to this problem, a technique has been proposed that realizes high-density mounting of electronic components by embedding the electronic components in a circuit substrate. However, in the case of a circuit substrate formed from ceramics, a firing process is required when housing electronic components, and thus an electronic component containing a semiconductor such as silicon or the like cannot be housed, which has been disadvantageous. As a solution to this, a circuit substrate also has been proposed that includes an insulating layer formed from a resin so that electronic components are housed therein (see, for example, JP 3-69191 A and JP11-103147 A). With this configuration, manufacturing can be performed at a relatively low temperature, and thus even an electronic component containing a semiconductor can be housed. However, due to the low thermal conductivity of the resin, it is difficult to radiate heat generated from the electronic components. Moreover, in the case where the electronic components are mounted with high density, heat radiation further is hindered. Further, inevitably, an influence also is exerted by the generation and propagation of noise due to a high-speed operation and high-density mounting.

As described above, in an electronic component built-in module in which electronic components are housed in a circuit substrate (mounted three-dimensionally in the circuit substrate), it is required to achieve not only high-density mounting and a high-level function but also an effect of reducing noise and an excellent heat radiation property. As a measure to meet this requirement, an electronic component built-in module has been proposed that includes an insulating layer formed from a mixture (composite resin material) containing a thermosetting resin such as an epoxy resin or the like and an inorganic filler such as ceramic powder or the like so that electronic components are embedded therein (see, for example, JP11-220262 A).

FIG. 10 shows an example of an electronic component built-in module in which electronic components are embedded in an insulating layer formed using a mixture of a thermosetting resin and an inorganic filler. In this electronic component built-in module 100, circuit substrates 101 on which electronic components (an active component 104a and a passive component 104b) are mounted are joined respectively to each main face of an insulating layer 102, and the electronic components 104a and 104b are embedded in the insulating layer 102. Moreover, wiring patterns 107 formed on the different circuit substrates 101 are connected electrically by an inner via 103 formed from a conductive resin composition. The insulating layer 102, which is formed from a mixture of an inorganic filler and a thermosetting resin, can be controlled in terms of a thermal conductivity, a dielectric constant and the like by selecting the type of the inorganic filler. Thus, an electronic component built-in module that is excellent in the effect of reducing noise and heat radiation property can be manufactured.

In an electronic component built-in module having the above-mentioned configuration, the reliability of an inner via is of importance. For example, due to heat applied when another electronic component is mounted by soldering on the completed electronic component built-in module, heat generated during an operation of equipment, a change in the temperature of an environment of use and the like, an insulating layer undergoes repeated cycles of thermal expansion and contraction. In this case, because of a difference in coefficient of thermal expansion between the insulating layer and a conductive resin composition constituting an inner via, a stress is generated in the inner via. Such a stress causes a deterioration in the connection reliability of an inner via. The insulating layer is formed so as to have a thickness not smaller than the height of each electronic component to be housed, and thus necessarily, the inner via penetrating the insulating layer in a thickness direction also has an increased length. Further, in order to achieve higher mounting density, it also is required that the inner via be decreased in diameter, and thus the inner via tends to have a high aspect ratio. Therefore, due to repeated cycles of the thermal expansion and contraction of the insulating layer in the thickness direction, a particularly large influence is exerted on a deterioration in the connection reliability of an inner via. In the case where a coefficient of thermal expansion of the insulating layer is larger than a coefficient of thermal expansion of circuit substrates, the expansion of the insulating layer in a plane direction is constrained by the circuit substrates, so that the insulating layer tends to expand in the thickness direction. Because of this, the connection reliability of an inner via becomes more likely to be deteriorated.

SUMMARY OF THE INVENTION

An electronic component built-in module according to the present invention includes a pair of opposed circuit substrates, each of which includes a wiring pattern and an insulating base material containing a resin, an insulating layer that is placed between the pair of circuit substrates and contains an inorganic filler and a resin composition containing a thermosetting resin, at least one electronic component that is embedded in the insulating layer, and an inner via that is provided in the insulating layer so as to make an electrical connection between wiring patterns provided on different circuit substrates. In the electronic component built-in module, a glass transition temperature Tg1 of the resin composition contained in the insulating layer and a glass transition temperature Tg2 of the insulating base material included in each of the circuit substrates satisfy a relationship Tg1>Tg2.

A method of manufacturing an electronic component built-in module according to the present invention includes the steps of: (a) preparing at least two circuit substrates, in each of which a wiring pattern is formed on an insulating base material that contains a resin and has a glass transition temperature Tg2, and mounting at least one electronic component on at least one of the circuit substrates; (b) forming a sheet-like material in which a through-hole is formed in a predetermined region, using a mixture containing an inorganic filler and an uncured resin composition that contains at least a thermosetting resin and has a glass transition temperature Tg1; (c) filling the through-hole with a conductive resin composition; (d) placing the sheet-like material between the circuit substrates so that a face of each of the at least one of the circuit substrates, on which the at least one electronic component is mounted, is directed to a side of the sheet-like material, and embedding the at least one electronic component inside the sheet-like material by applying pressure in a thickness direction so that the sheet-like material and the circuit substrates are formed into one body; and (e) forming an insulating layer by allowing the thermosetting resin contained in the sheet-like material to be cured. In the method, the glass transition temperature Tg1 and the glass transition temperature Tg2 satisfy a relationship Tg1>Tg2.

DETAILED DESCRIPTION OF THE INVENTION

Figure 1:
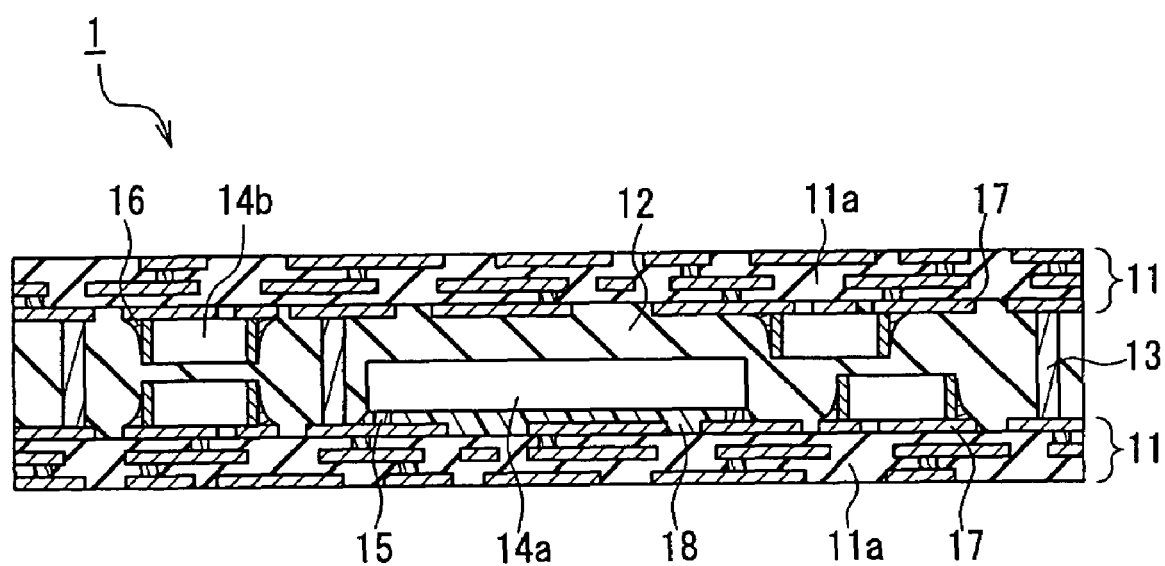
FIG. 1 is a cross sectional view showing one embodiment of an electronic component built-in module according to the present invention.

In the electronic component built-in module according to the present invention, the glass transition temperature Tg1 of the resin composition contained in the insulating layer is higher than the glass transition temperature Tg2 of the insulating base material included in each of the circuit substrates that interpose the insulating layer between them. In the case where the resin composition contained in the insulating layer contains a plurality of types of resins varying in glass transition temperature, in the present invention, the glass transition temperature Tg1 of the resin composition refers to the lowest value of a plurality of values of the glass transition temperature. Further, in the present invention, the glass transition temperature Tg2 of the insulating base material is determined by a glass transition temperature of a material that is contained in the insulating base material and has a glass transition point. For example, in the case where a plurality of materials that have a glass transition point are contained in the insulating base material, the glass transition temperature Tg2 is determined by the lowest value of values of the glass transition temperature.

Generally, a resin material is softened at a temperature not lower than a glass transition temperature. A coefficient of thermal expansion at a temperature in a range of temperatures not lower than the glass transition temperature is larger than a coefficient of thermal expansion at a temperature in a range of temperatures not higher than the glass transition temperature. Therefore, for example, when in the case of mounting another electronic component the temperature of the electronic component built-in module according to the present invention is raised to a temperature not lower than the glass transition temperature Tg1 of the insulating layer, the temperature of the circuit substrates also is raised to a temperature not lower than the glass transition temperature Tg1. Accordingly, the temperature of the circuit substrates attains a temperature not lower than the glass transition temperature Tg2 of the insulating base material included in each of the circuit substrates. As a result, both of a coefficient of thermal expansion of the insulating layer and a coefficient of thermal expansion of the circuit substrates are increased. Therefore, a phenomenon in which elongation of the insulating layer in a plane direction due to thermal expansion is restricted by the circuit substrates, which is caused because of a coefficient of thermal expansion of the circuit substrates that is too small with respect to a coefficient of thermal expansion of the insulating layer, can be suppressed. That is, the thermal expansion of the insulating layer in the plane direction is enabled, and thus excessive thermal expansion in the thickness direction becomes less likely to be caused. Thus, an excessively large tensile stress becomes less likely to be generated in a length direction of the inner via formed in the insulating layer, thereby achieving improved connection reliability. Hereinafter, this phenomenon will be described more specifically with reference to FIGS. 2 and 3.

Figure 2:
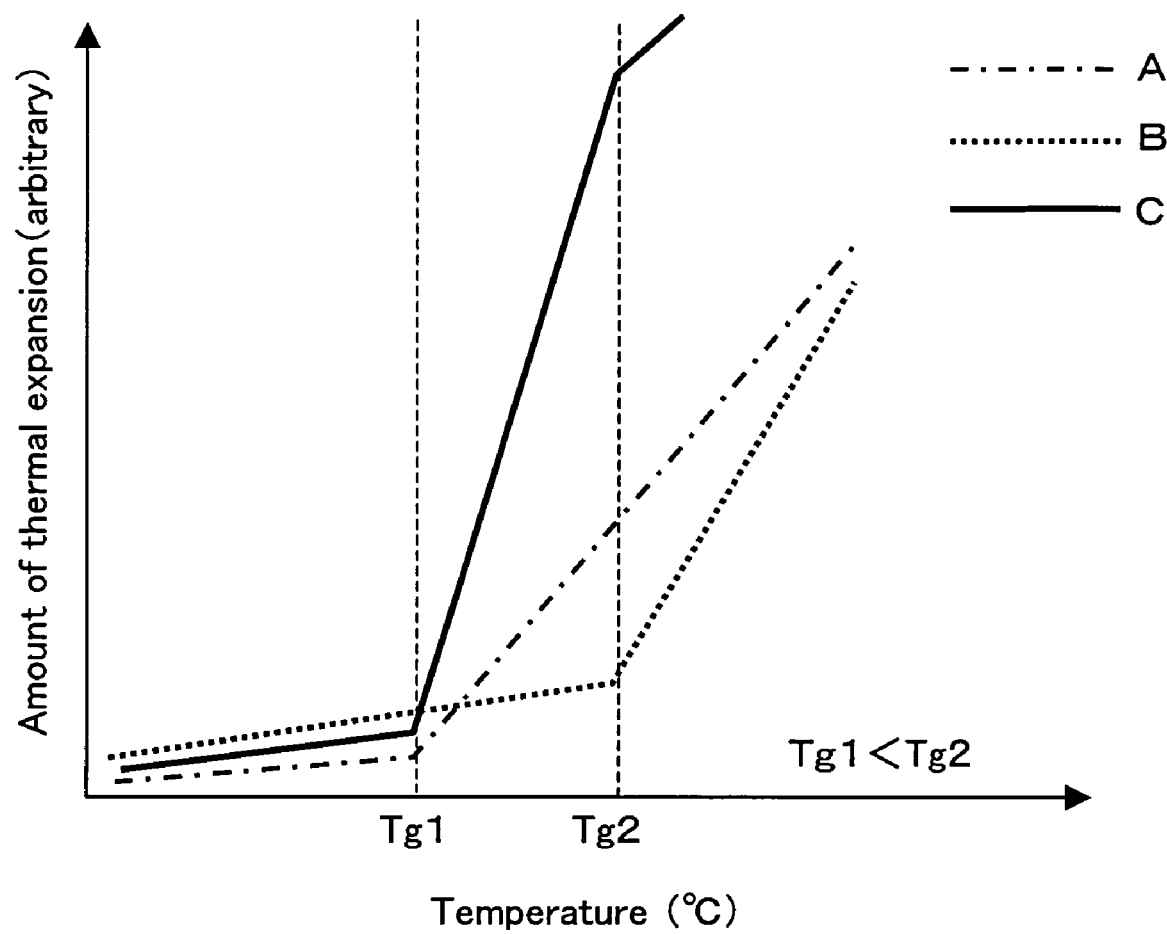
FIG. 2 is a schematic diagram showing a relationship between an amount of thermal expansion and a temperature with respect to each of an insulating layer alone, a circuit substrate alone, and the insulating layer interposed between the circuit substrates, where Tg1<Tg2.

First, by referring to FIG. 2, description is directed to the thermal expansion of an insulating layer in the case where a glass transition temperature Tg1 of a resin composition contained in the insulating layer is lower than a glass transition temperature Tg2 of an insulating base material included in a circuit substrate (Tg1<Tg2). In FIG. 2, a curve A indicates an amount of thermal expansion in a plane and thickness directions in the case where the insulating layer is present alone. A curve B indicates an amount of thermal expansion in the plane direction in the case where the circuit substrate is present alone. A curve C indicates an amount of thermal expansion in the thickness direction of the insulating layer placed between a pair of the circuit substrates. Where Tg1<Tg2, for example, when in the case of mounting another electronic component a temperature rise to a temperature not lower than the glass transition temperature Tg1 of the insulating layer is caused, the insulating layer exhibits an amount of thermal expansion in the plane and thickness directions that tends to increase as shown by the curve A. In this case, the circuit substrates that interpose the insulating layer between them are at a temperature not higher than the glass transition temperature Tg2 of the insulating base material, and thus each of the circuit substrates exhibits an amount of thermal expansion in the plane direction that is small as shown by the curve B. Therefore, elongation in the plane direction of the insulating layer due to thermal expansion is restricted by the circuit substrates. Thus, a phenomenon is caused in which an amount of thermal expansion of the insulating layer in the thickness direction, which is interposed between the circuit substrates, increases excessively as shown by the curve C so as to compensate for an amount of thermal expansion of the insulating layer to the plane direction. Due to such excessive thermal expansion in the thickness direction in the insulating layer, an excessively large tensile stress is generated in a length direction in an inner via formed in the insulating layer, resulting in a deterioration in the connection reliability of an inner via.

Figure 3:
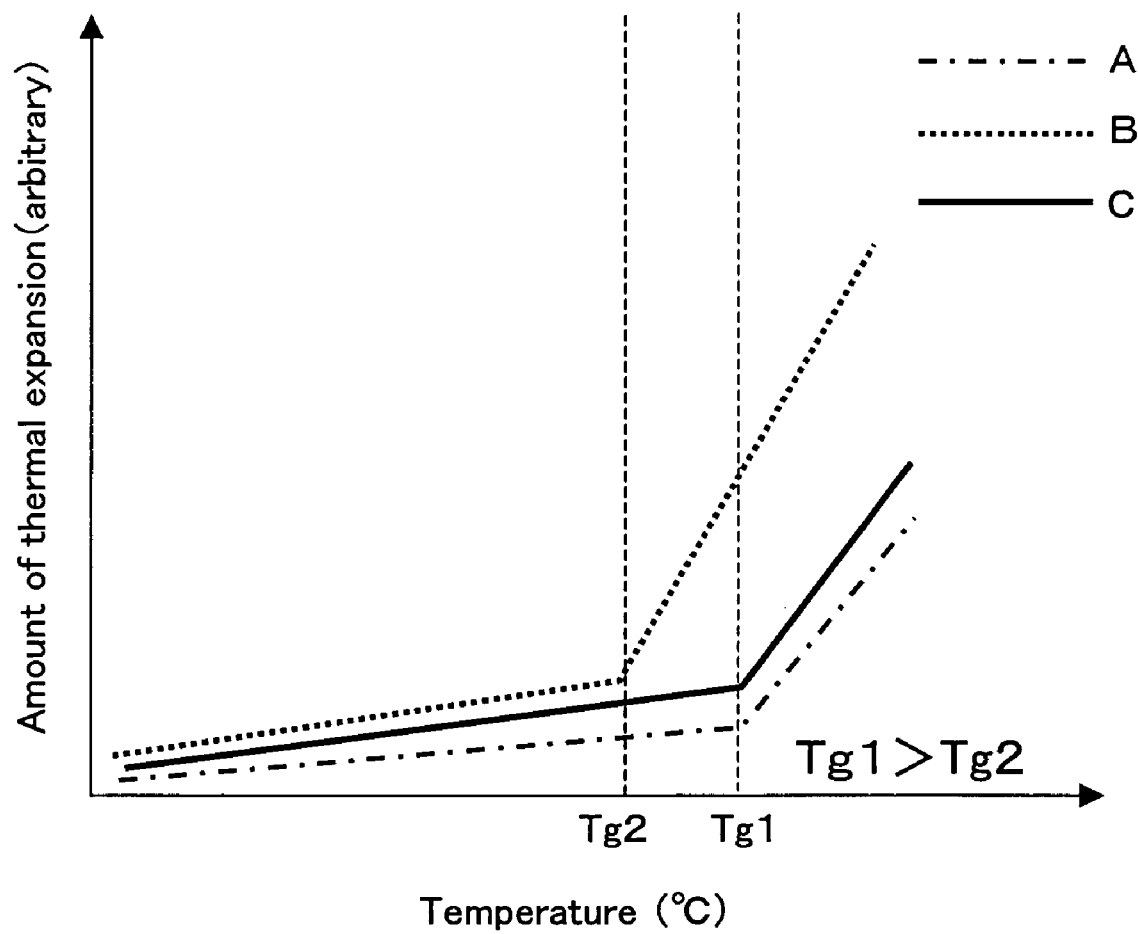
FIG. 3 is a schematic diagram showing a relationship between an amount of thermal expansion and a temperature with respect to each of a insulating layer alone, a circuit substrate alone, and the insulating layer interposed between the circuit substrates, where Tg1>Tg2.

Next, by referring to FIG. 3, description is directed to the thermal expansion of an insulating layer in the case where, as in the present invention, a glass transition temperature Tg1 of a resin composition contained in the insulating layer is higher than a glass transition temperature Tg2 of an insulating base material included in a circuit substrate (Tg1>Tg2). In the same manner as in the case shown in FIG. 2, a curve A indicates an amount of thermal expansion in a plane and thickness directions in the case where the insulating layer is present alone. A curve B indicates an amount of thermal expansion in the plane direction in the case where the circuit substrate is present alone, and a curve C indicates an amount of thermal expansion in the thickness direction of the insulating layer placed between a pair of the circuit substrates. Where Tg1>Tg2, for example, when in the case of mounting another electronic component a temperature rise to a temperature not lower than the glass transition temperature Tg1 of the insulating layer is caused, the insulating layer exhibits an amount of thermal expansion in the plane and thickness directions that tends to increase as shown by the curve A. In this case, the temperature of the circuit substrates also is raised to a temperature not lower than the glass transition temperature Tg1, and thus a temperature higher than the glass transition temperature Tg2 of the insulating base material already is attained. As a result, an amount of thermal expansion of the circuit substrates in the plane direction increases with increasing amount of thermal expansion of the insulating layer in the plane direction as shown by the curve B. Therefore, a phenomenon in which elongation of the insulating layer in the plane direction due to thermal expansion is restricted by the circuit substrates can be suppressed. That is, the thermal expansion of the insulating layer in the plane direction is enabled, and thus, as shown by the curve C, the excessive thermal expansion of the insulating layer in the thickness direction becomes less likely. Thus, an excessively large tensile stress becomes less likely to be generated in a length direction in an inner via formed in the insulating layer, thereby achieving improved connection reliability.

Furthermore, the insulating layer contains an inorganic filler, and thus heat generated from an electronic component is likely to be radiated. By selecting a material of the inorganic filler, the thermal conductivity, dielectric constant and the like of the insulating layer can be controlled so as to correspond to an electronic component to be housed.

Preferably, in the electronic component built-in module according to the present invention, a difference between the glass transition temperature Tg1 of the resin composition contained in the insulating layer and the glass transition temperature Tg2 of the insulating base material included in each of the circuit substrates is not less than 10° C. This is preferable in order to reduce breaking of an inner via and thereby to achieve higher connection reliability. Further, preferably, the difference between the glass transition temperature Tg1 and the glass transition temperature Tg2 is not more than 200° C.

In the electronic component built-in module according to the present invention, a plurality of the insulating layers also can be provided. This allows higher-density mounting to be realized.

Preferably, in the electronic component built-in module according to the present invention, the insulating layer contains the inorganic filler in an amount of not less than 70% by weight and not more than 95% by weight. This is preferable in order to achieve a further improvement in the heat radiation property of an insulating layer.

Preferably, in the electronic component built-in module according to the present invention, the inorganic filler contains at least one selected from the group consisting of: $Al_2O_3$, MgO, BN, $SiO_2$, SiC, $Si_3N_4$, and AlN. This is preferable in order to achieve a further improvement in the heat radiation property of an insulating layer.

Preferably, in the electronic component built-in module according to the present invention, the thermosetting resin contains at least one selected from the group consisting of: an epoxy resin, a phenol resin, and an isocyanate resin. This is preferable in order to achieve an improvement in the electrical insulation property, mechanical strength, and heat resistance of an insulating layer.

Preferably, in the electronic component built-in module according to the present invention, the at least one electronic component is formed of a semiconductor bare chip. This is preferable because this allows an electronic component to be mounted by flip-chip mounting on a circuit substrate using a bump, thereby enabling a shortest distance connection between the electronic component and a wiring pattern.

Preferably, in the electronic component built-in module according to the present invention, the inner via is formed from a conductive resin composition. This is preferable because this allows an inner via to be formed easily.

Next, description is directed to the method of manufacturing an electronic component built-in module according to the present invention. According to the method of manufacturing an electronic component built-in module according to the present invention, the electronic component built-in module according to the present invention can be manufactured easily.

Preferably, in the method of manufacturing an electronic component built-in module according to the present invention, in the step (d), an electronic component built-in layer, in which at least one electronic component is embedded in an insulating member containing a resin composition having the glass transition temperature Tg1, further is placed between the circuit substrates, and pressure is applied in the thickness direction. This is preferable in order to manufacture an electronic component built-in module in and on which electronic components are mounted with higher density.

Preferably, in the method of manufacturing an electronic component built-in module according to the present invention, in the step (d), at least two sheet-like materials, and an electronic component built-in layer in which at least one electronic component is embedded in an insulating member containing a resin composition having the glass transition temperature Tg1, are placed between the circuit substrates so that the sheet-like materials are in contact with the circuit substrates, and pressure is applied in the thickness direction. This is preferable in order to manufacture an electronic component built-in module in and on which electronic components are mounted with higher density.

Preferably, in the method of manufacturing an electronic component built-in module according to the present invention, a method of manufacturing the electronic component built-in layer includes the steps of: forming a wiring pattern on one face of a mold release carrier, and further mounting at least one electronic component thereon; forming a sheet-like material in which a through-hole is formed in a predetermined region, using a mixture containing an inorganic filler and an uncured resin composition that contains at least a thermosetting resin and has the glass transition temperature Tg1; filling the through-hole with a conductive resin composition; laminating the mold release carrier on the sheet-like material so that the one face of the mold release carrier, on which the at least one electronic component is mounted, is directed to a side of the sheet-like material, and embedding the at least one electronic component inside the sheet-like material by applying pressure in a lamination direction; and peeling the mold release carrier from the sheet-like material. This is preferable because this allows an electronic component built-in layer to be formed easily.

Hereinafter, the present invention will be described by way of embodiments with reference to the appended drawings.

Embodiment 1

FIG. 1 is a cross sectional view showing a configuration of an electronic component built-in module according to Embodiment 1 of the present invention. In an electronic component built-in module 1 according to this embodiment, a circuit substrate 11 is placed on each main face of an insulating layer 12 in which electronic components (an active component 14a and a passive component 14b) are embedded. The circuit substrate 11 has a configuration in which wiring patterns 17 are formed in and on an insulating base material 11a containing a resin. The circuit substrates 11 are of a multilayer wiring structure with a plurality of wiring layers, and the wiring patterns 17 are placed on a main face and in an inner portion of the circuit substrate 11. In this specification, one wiring layer is formed of a group of wiring patterns that are formed on a common plane. The electronic components 14a and 14b that are embedded in the insulating layer 12 are connected electrically to the wiring patterns 17 formed on the main face of the circuit substrate 11. In the insulating layer 12, an inner via 13 is formed so as to make an electrical connection between the wiring patterns 17 that are formed respectively on a pair of the circuit substrates 11 that are placed so as to be opposed to each other.

The circuit substrate 11 can be formed of a glass-epoxy substrate, a buildup substrate or the like that is a printed wiring board in common use, and there is no particular limit thereto. Further, in this embodiment, three wiring layers are provided. However, the number of the wiring layers is not limited thereto.

As a material of the wiring patterns 17 provided on the circuit substrate 11, any material can be used as long as the material has excellent electrical conductivity and allows a circuit to be formed easily, and there is no particular limit thereto. In particular, it is preferable to use metal foil. Metal foil of, for example, copper, nickel, aluminum, and an alloy mainly containing any of these metals can be used. Preferred among these metals are copper and an alloy mainly containing copper. This is because copper is excellent in electrical conduction property and less costly, thereby making it easier to form a wiring pattern. Further, preferably, in metal foil used for the wiring patterns 17, a face to be brought into contact with the insulating layer 12 and the inner via 13 is roughened. This is preferable because this allows the bonding strength between the metal foil and each of the insulating layer 12 and the inner via 13 to be improved. In FIG. 1, in each of the circuit substrates 11, the wiring patterns 17 on a face on which the electronic components 14a and 14b are mounted are formed so as to protrude from the face, and the wiring patterns 17 on a face opposed to the face are formed so as to be embedded in the circuit substrate 11. However, the configuration of the wiring patterns 17 is not limited thereto. The wiring patterns 17 may protrude from a face of the circuit substrate 11 or may be embedded in the circuit substrate 11.

The insulating layer 12 is a layer formed from a resin composition containing at least a thermosetting resin, in which an inorganic filler is dispersed. The insulating layer 12 is formed so that a glass transition temperature Tg1 of the resin composition is higher than a glass transition temperature Tg2 of the insulating base material 11a of the circuit substrate 11. The thermal conductivity, dielectric constant and the like of the insulating layer 12 can be adjusted by selecting the respective types of the thermosetting resin and the inorganic filler.

Desirably, in the resin composition used in the insulating layer 12, the thermosetting resin contains at least one selected from the group consisting of, for example, an epoxy resin, a phenol resin, and an isocyanate resin. This is desirable because each of these types of thermosetting resins in the form of a cured body is excellent in electrical insulation property, mechanical strength, and heat resistance. Further, preferably, the resin composition contains additives such as a coupling agent, a dispersing agent, a coloring agent and the like as required. This is preferable because including these various additives allows the properties of the insulating layer 12 to be improved. For example, a coupling agent can improve the adhesion between the resin composition and the inorganic filler. Further, a dispersing agent can improve the dispersibility of the inorganic filler, thereby allowing composition unevenness in a mixture to be reduced.

Further, desirably, the inorganic filler contains at least one selected from the group consisting of: $Al_2O_3$, MgO, BN, $SiO_2$, SiC, $Si_3N_4$, and AlN. This is desirable because these materials have an excellent thermal conduction property and thus allow the heat radiation property of the insulating layer 12 to be improved, so that heat generated from the electronic components 14a and 14b that are housed can be radiated more effectively. Particularly, in the case of using an inorganic filler of $Al_2O_3$, a lower manufacturing cost can be achieved. Further, in the case of using an inorganic filler of $SiO_2$, the dielectric constant and the dielectric loss tangent of the insulating layer 12 can be decreased, thereby improving an effect of reducing noise. Moreover, when consideration is given to the filling property of the inorganic filler and the heat radiation property of the insulating layer 12, the inorganic filler has a mean particle diameter in a range of, suitably, 0.1 to 100 μm, and more preferably, 7 to 12 μm.

In the mixture of the resin composition and the inorganic filler, the inorganic filler is contained in an amount of, suitably, 70 to 95% by weight, preferably, 85 to 93% by weight, and more preferably, 89 to 91% by weight, and the resin composition is contained in an amount of, suitably, 5 to 30% by weight, preferably, 7 to 15% by weight, and more preferably, 9 to 11% by weight for the following reason. That is, in the case where the inorganic filler is contained in an amount in the above-mentioned ranges, the flowability and adhesion of the mixture are improved, thereby achieving excellent adhesion to metal foil. Further, this allows an excellent heat radiation property to be obtained.

Desirably, the inner via 13 is formed from a conductive resin composition of a mixture of metal particles and a thermosetting resin. As for the metal particles, it is preferable to use particles of a metal that has high electrical conductivity such as gold, silver, copper, nickel or the like. Particularly preferred among these metals is copper because copper has excellent electrical conductivity and further, ion migration is less likely to be caused therein. Further, as for the thermosetting resin, it is preferable to use a liquid epoxy resin in terms of heat resistance.

The active component 14a is connected electrically to the wiring patterns 17 through a bump 15. A connecting portion between the active component 14a and the wiring patterns 17 is encapsulated with an encapsulating resin 18. As the active component 14a, a semiconductor element such as, for example, a transistor, an IC, a LSI or the like is used. Particularly, it is desirable to use a semiconductor bear chip as the active component 14a. This is because by flip-chip mounting, wires connecting between the wiring patterns 17 and each of the electronic components 14a and 14b can be shortened, thereby achieving an excellent electrical property. There is no particular limit to a flip-chip mounting method. Connection can be established by, for example, a bump mainly containing solder or a conductive adhesive, a metallic bump formed on an electrode of a semiconductor element and solder or a conductive adhesive.

The passive component 14b is connected electrically to the wiring patterns 17 by a connecting member 16. As the passive component 14b, for example, a chip-like resistor, a capacitor, an inductor or the like is used. The connecting member 16 can be formed from, for example, a soldering material, a conductive adhesive or the like.

In the electronic component built-in module 1 according to this embodiment, the glass transition temperature Tg1 of the resin composition contained in the insulating layer 12 is higher than the glass transition temperature Tg2 of the insulating base material 11a of the circuit substrate 11. Therefore, even when in the case of mounting another component by soldering on the electronic component built-in module the temperature of the electronic component built-in module is raised to a temperature not lower than the glass transition temperature Tg1, the insulating layer 12 can be expanded in a plane direction. Thus, excessive expansion in a thickness direction can be suppressed. Thus, the application of an excessively large tensile stress in the thickness direction of the insulating layer 12 with respect to the inner via 13 is suppressed, and thus connection failure becomes less likely to be caused. This allows the electronic component built-in module to be highly reliable.

Next, an example of a method of manufacturing the electronic component built-in module 1 will be described with reference to FIGS. 4A and 4B.

First, an insulating material in an uncured state that is a mixture of an inorganic filler and a resin composition containing at least a thermosetting resin is processed into a sheet-like material 19. The resin composition used herein is selected appropriately so that a glass transition temperature Tg1 of the resin composition is higher than the glass transition temperature Tg2 of the insulating base material 11a of the circuit substrate 11. A through-hole is formed at predetermined position(s) in the sheet-like material 19, and the through-hole is filled with a conductive resin composition 20 containing a thermosetting resin. In processing the sheet-like material 19, a paste-like mixture is used that is formed by mixing the inorganic filler with the resin composition containing the liquid thermosetting resin or by mixing into the inorganic filler the thermosetting resin whose viscosity is decreased using a solvent. Specifically, the paste-like mixture is molded so as to have a predetermined thickness by a doctor-blade method or the like and is subjected to a heat treatment, and thus the sheet-like material 19 is obtained. In the case where the mixture is formed using a liquid thermosetting resin, the mixture has adhesion properties. The heat treatment is performed so that such adhesion properties are eliminated by slightly curing the mixture while maintaining flexibility of the mixture in an uncured state. Further, in the case where the mixture is formed by allowing a thermosetting resin to be dissolved using a solvent, the heat treatment is performed so that the solvent is removed, and similarly, adhesion properties are eliminated while maintaining the flexibility of the mixture in an uncured state. The through-hole to be formed in the sheet-like material 19 in the uncured state that is formed in the above-described manner can be formed by a laser processing method, processing using a metallic mold, punch processing or the like. Particularly, in the laser processing method, it is effective to use a carbon gas laser and an excimer laser in terms of a processing speed.

Furthermore, the electronic components (the active component 14a, the passive component 14b) are mounted on the circuit substrates 11. The active component 14a is, for example, a semiconductor bare chip and is connected electrically to the wiring patterns 17 using the bump 15. A connecting portion between the semiconductor bare chip and the wiring patterns 17 is encapsulated with the encapsulating resin 18. The passive component 14b is connected electrically to the wiring patterns 17 using the connecting member 16 such as a soldering material, a conductive adhesive or the like.

Figure 4A:
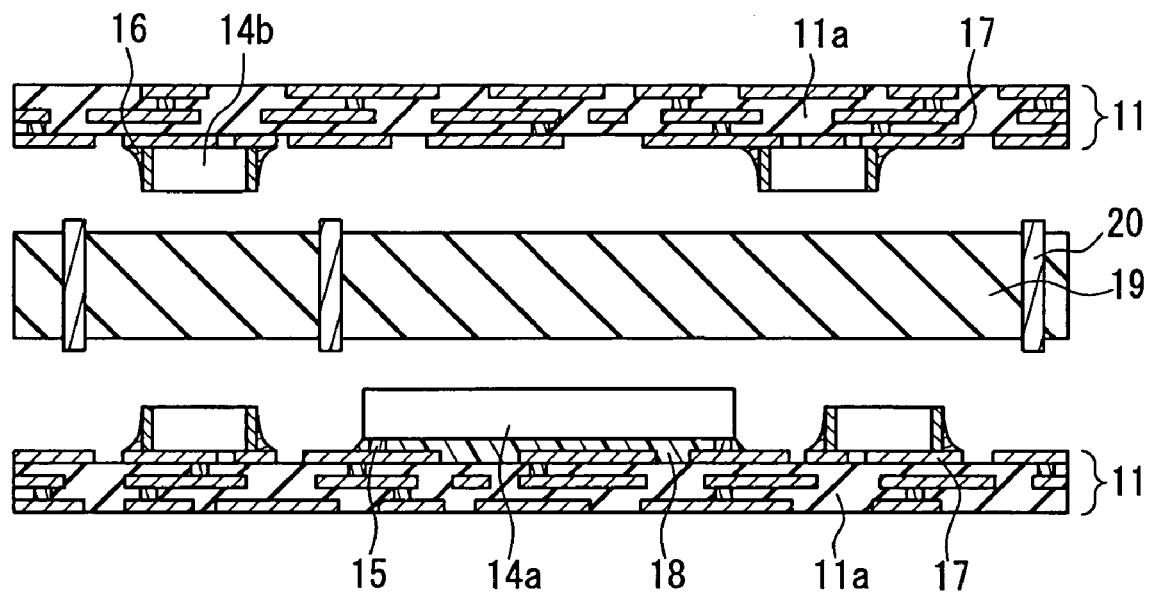
FIGS. 4A and 4B are cross sectional views, each showing a process step in a method of manufacturing an electronic component built-in module according to one embodiment of the present invention.
Figure 4B:
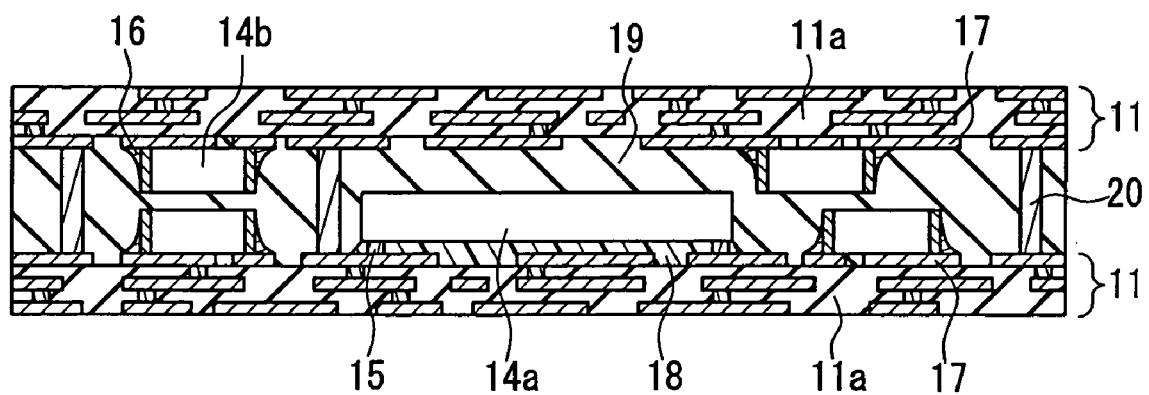

Next, positioning of each of the circuit substrates 11 on which the electronic components 14a and 14b are mounted is performed with respect to each main face of the sheet-like material 19 (see FIG. 4A).

Next, the sheet-like material 19 and the circuit substrates 11 that have been aligned by the positioning are laminated. A laminate thus obtained is heated, and pressure is applied thereto in a lamination direction. This allows the electronic components 14a and 14b mounted on the circuit substrates 11 to be embedded in the sheet-like material 19, so that the laminate as a whole is formed into one body (see FIG. 4B). In this case, the electronic components 14a and 14b are embedded in the sheet-like material in a state where the thermosetting resin contained in the sheet-like material 19 is yet to be cured.

Later, heating further is performed so that the thermosetting resin contained in the sheet-like material 19 and the conductive resin composition 20 are cured completely. Thus, the insulating layer and the inner via are formed, and the circuit substrates 11, the insulating layer, and the electronic components 14a and 14b are joined firmly together. Further, by the inner via formed due to curing of the conductive resin composition 20, an electrical connection is made between the wiring patterns 17 on the circuit substrates 11 that are placed so as to be opposed to each other through the insulating layer.

The electronic component built-in module 1 (see FIG. 1) can be manufactured by the above-described method.

Embodiment 2

Figure 5:
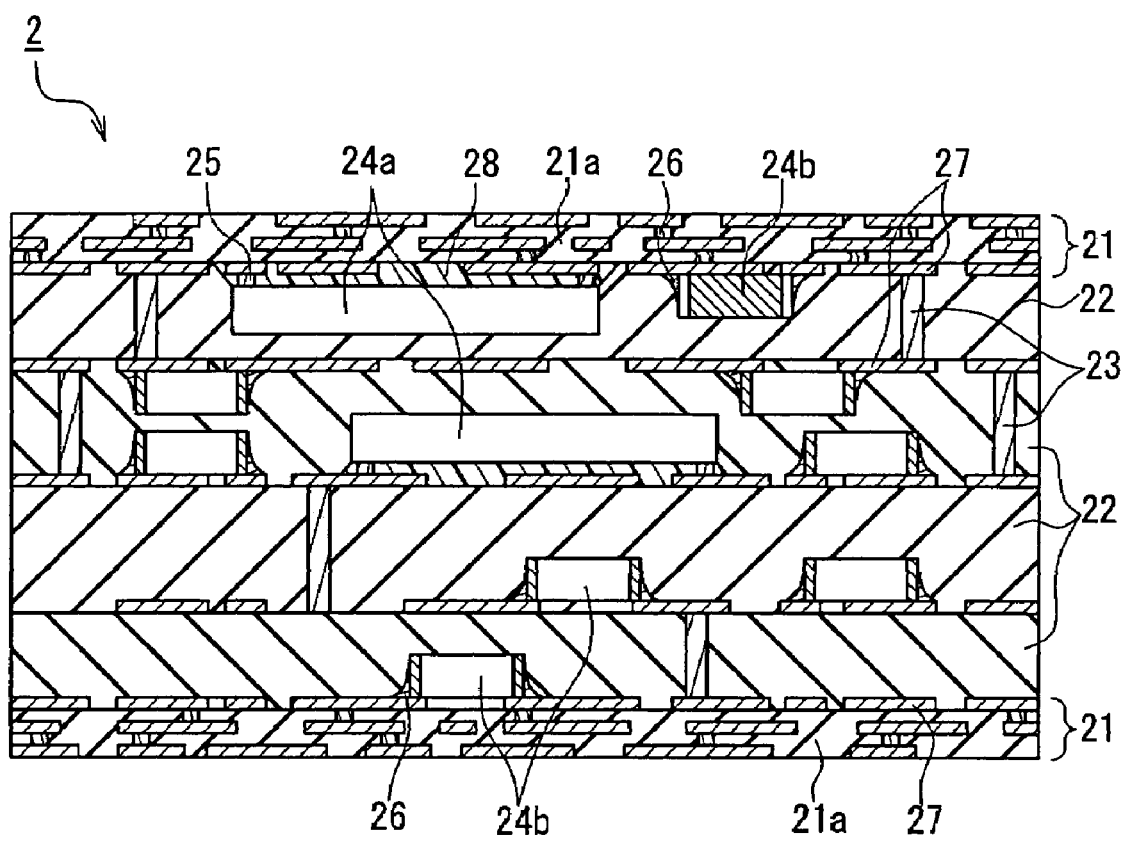
FIG. 5 is a cross sectional view showing a configuration of an electronic component built-in module according to another embodiment of the present invention.

FIG. 5 is a cross sectional view showing a configuration of an electronic component built-in module according to Embodiment 2 of the present invention.

In an electronic component built-in module 2 according to this embodiment, a plurality of insulating layers 22 are placed between a pair of opposed circuit substrates 21. Electronic components (an active component 24a, a passive component 24b) are embedded in the insulating layers 22. Wiring patterns 27 may be formed on a main face and in an inner portion of each of the circuit substrates 21, and thus a multilayer wiring structure is obtained. Further, the wiring patterns 27 may be formed also on each interface between the insulating layers 22. In each of the insulating layers 22, an inner via 23 is formed at each predetermined position so as to make an electrical connection between the wiring patterns 27 that are formed on different layers. The active component 24a is connected electrically to the wiring patterns 27 through a bump 25, and a connecting portion between the active component 24a and the wiring patterns 27 is encapsulated with an encapsulating resin 28. Further, the passive component 24b is connected electrically to the wiring patterns 27 by a connecting member 26.

In the same manner as in the case of the circuit substrate 11 described with regard to Embodiment 1, each of the circuit substrates 21 has a configuration in which the wiring patterns 27 are formed in and on an insulating base material 21a, and can be formed from the same materials as those used in the case of the circuit substrate 11. Further, the insulating layers 22 have the same configuration as that of the insulating layer 12 described with regard to Embodiment 1, and can be formed from the same materials as those used in the case of the insulating layer 12. In this case, a glass transition temperature Tg1 of a resin composition contained in each of the insulating layers 22 is higher than a glass transition temperature Tg2 of the insulating base material 21a of each of the circuit substrates 21. Thus, the same effect as that obtained in the case of the electronic component built-in module 1 according to Embodiment 1 can be attained.

In this embodiment, four insulating layers 22 are provided. However, a higher number of the insulating layers 22 can be provided.

Next, an example of a method of manufacturing the electronic component built-in module 2 will be described with reference to FIGS. 6A to 6C and FIGS. 7A and 7B.

First, description is directed to a method of forming an electronic component built-in layer used for manufacturing the electronic component built-in module 2.

Figure 6A:
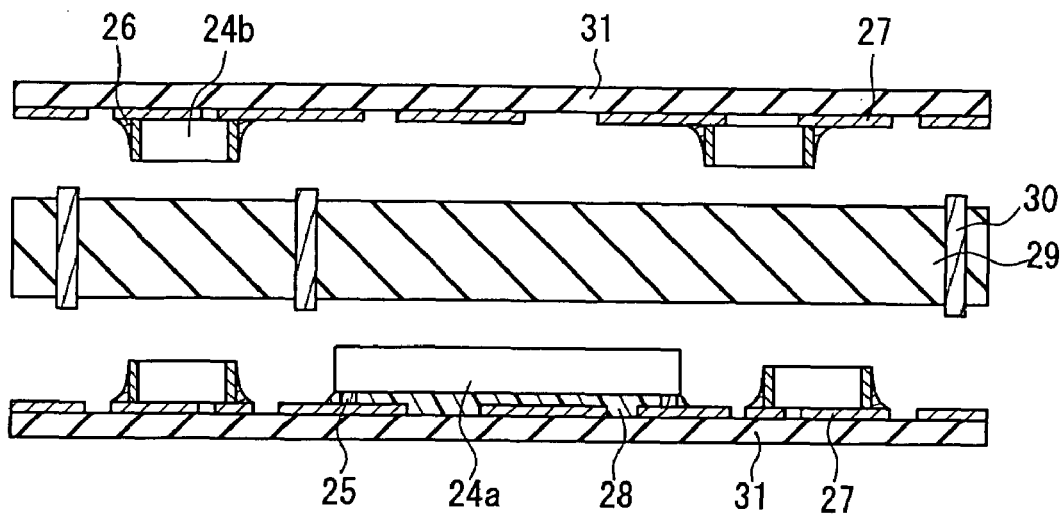
FIGS. 6A to 6C are cross sectional views showing process steps of manufacturing an electronic component built-in layer that is used for manufacturing the electronic component built-in module according to another embodiment of the present invention.

Positioning of each of mold release carriers 31 on which the wiring patterns 27 and the electronic components 24a and 24b are formed is performed with respect to each main face of a sheet-like material 29 (see FIG. 6A).

The sheet-like material 29 is formed by the same method using the same materials as those used in the case of the sheet-like material 19 described with regard to Embodiment 1. A through-hole formed at each predetermined position of the sheet-like material 29 is filled with a conductive resin composition 30. The through-hole is formed by the same method as that described with regard to Embodiment 1.

The wiring patterns 27 are formed on each of the mold release carriers 31, and the electronic components 24a and 24b are mounted on the wiring patterns 27. The mold release carriers 31 are peeled off after the wiring patterns 27 are transferred onto the sheet-like material 29, and can be formed of an organic film of polyethylene, polyethylene terephthalate or the like, and metal foil of copper, aluminum or the like. The wiring patterns 27 are formed on each of the mold release carriers 31 by the following method. That is, a metal layer of copper foil or the like is formed on the mold release carrier 31, and the metal layer is processed into the wiring patterns 27 using an existing processing technique such as a chemical etching method or the like. The metal layer is formed by the following method. That is, in the case of the mold release carrier 31 formed of an organic film, metal foil is bonded using an adhesive. In the case of the mold release carrier 31 formed of metal foil, a metal plating film is formed using an electrolytic plating method or the like. Further, preferably, in the case of the mold release carrier 31 formed of metal foil, a peeling layer is provided between the mold release carrier 31 and the metal layer. There is no particular limit to a material of the peeling layer, and the peeling layer can be formed of a thin organic layer or a metal plating layer of nickel, chromium, lead or the like. Desirably, the bonding strength between the mold release carrier 31 and the wiring patterns 27 is such that the wiring patterns 27 bonded to the sheet-like material 29 are not peeled off when the mold release carrier 31 is peeled off in a process of transferring the wiring patterns 27. Moreover, desirably, a surface of each of the wiring patterns 27 as a contact surface is roughened so that excellent adhesion to the sheet-like material 29 is obtained. Further, in order to obtain adhesion and prevent oxidization, the wiring patterns 27 having a surface that has been subjected to a coupling treatment or a surface on which a plating film of tin, zinc or nickel also can be used.

Next, the sheet-like material 29 and the mold release carriers 31 that have been aligned by the positioning are laminated. Pressure is applied in the thickness direction to a laminate thus obtained, and the laminate is heated at a temperature in a range of temperatures at which a thermosetting resin contained in the sheet-like material 29 is not cured. This allows the electronic components 24a and 24b to be embedded in the uncured sheet-like material 29, so that the laminate as a whole is formed into one body (see FIG. 6B). In this case, pressure further is applied so that the wiring patterns 27 on the mold release carriers 31 also are embedded in the sheet-like material 29.

Figure 6B:
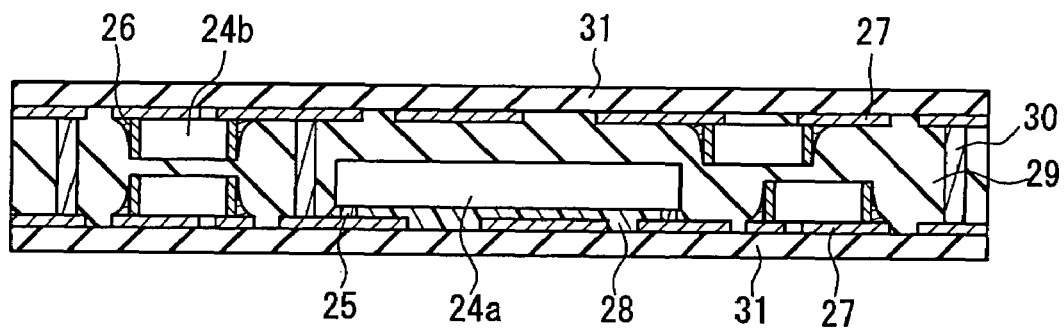
Figure 6C:
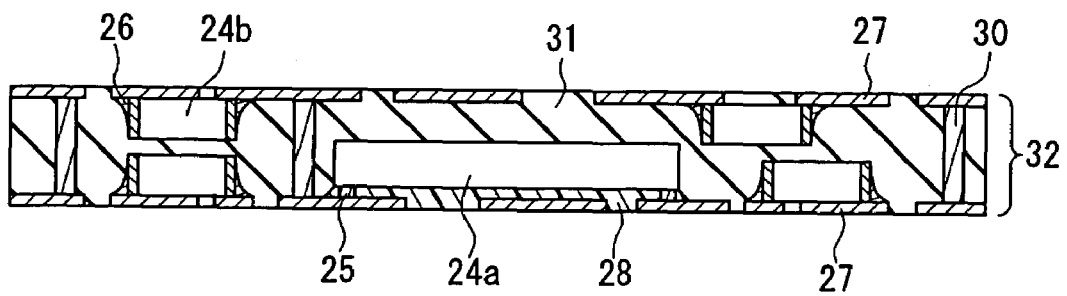
Figure 7A:
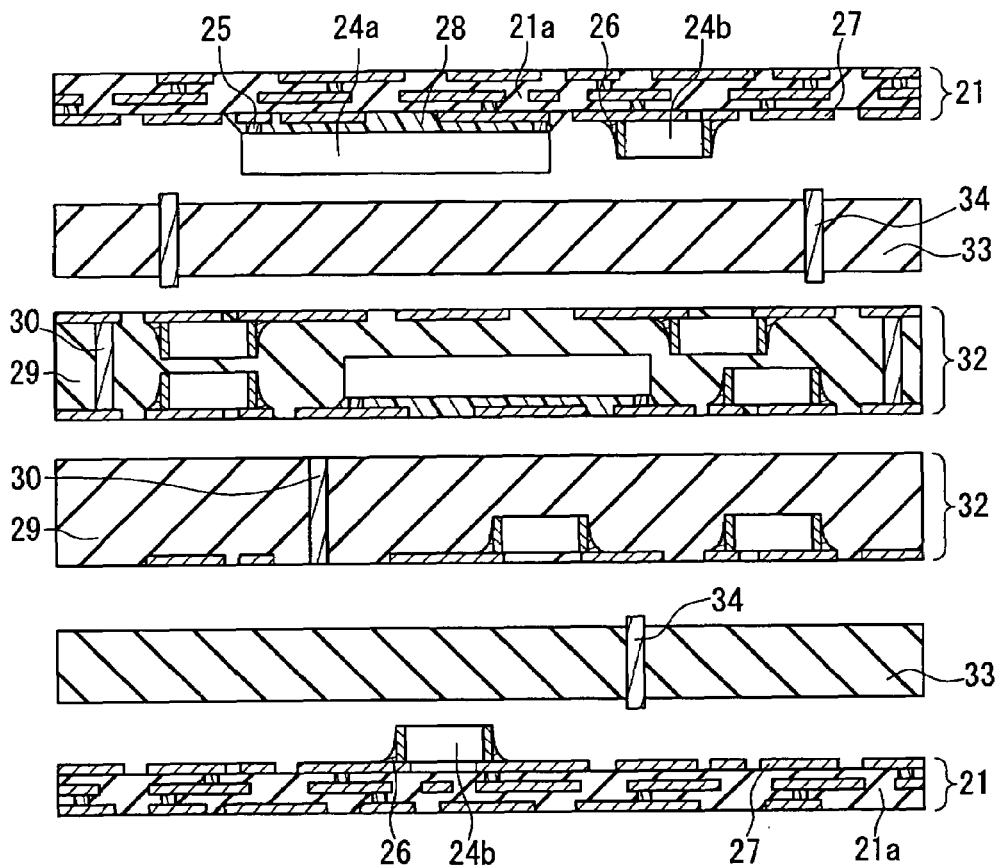
FIGS. 7A and 7B are cross sectional views, each showing a process step in a method of manufacturing the electronic component built-in module according to another embodiment of the present invention.
Figure 7B:
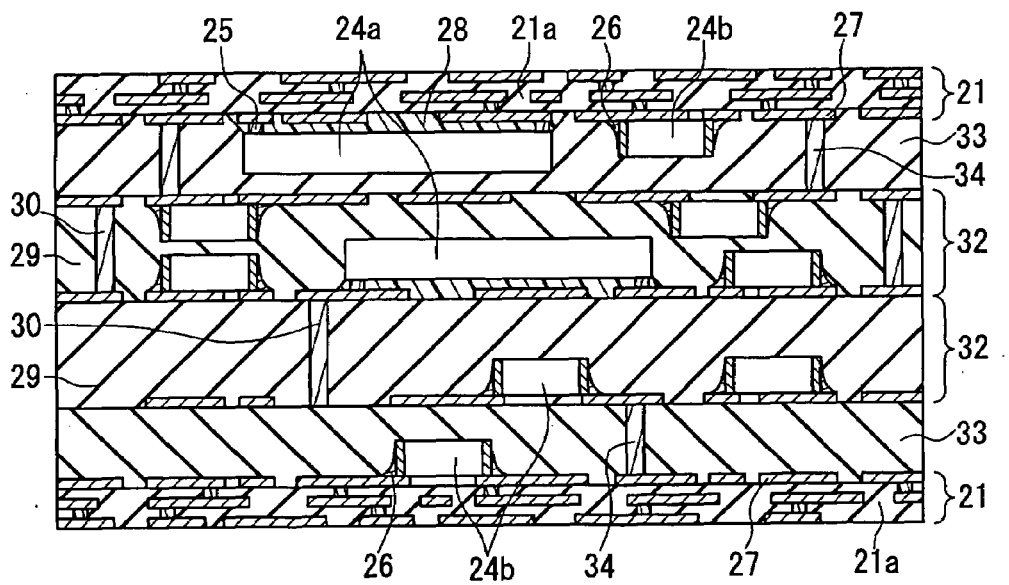

Next, the mold release carriers 31 are removed from the sheet-like material 29 in which the electronic components 24a and 24b and the wiring patterns 27 are embedded (see FIG. 6C). Thus, an electronic component built-in layer 32 with a surface being in a smooth state, in which the electronic components 24a and 24b and the wiring patterns 27 are embedded in an insulating member, can be formed.

Next, two circuit substrates 21 as well as two sheet-like materials 33 that are formed separately are prepared. On each of the circuit substrates 21, the wiring patterns 27 on which the electronic components 24a and 24b are mounted are formed. In each of the sheet-like materials 33, a through-hole formed at each predetermined position is filled with a conductive resin composition 34. Two electronic component built-in layers 32 that are formed by the method shown in FIGS. 6A to 6C are placed between the circuit substrates 21 through the sheet-like materials 33, and positioning of the circuit substrates 21, the electronic component built-in layers 32, and the sheet-like materials 33 is performed (see FIG. 7A). The sheet-like materials 33 are formed by the same method as that used in the case of the sheet-like material 19 (see FIG. 4A).

Next, the circuit substrates 21, the sheet-like materials 33, and the electronic component built-in layers 32 that have been aligned by the positioning are laminated. Pressure is applied in the thickness direction to a laminate thus obtained, and the laminate is heated at a temperature in a range of temperatures at which the thermosetting resin contained in each of the sheet-like materials 33 and the electronic component built-in layers 32 is not cured. This allows the electronic components mounted on the circuit substrates 21 to be embedded in the uncured sheet-like materials 33, so that the laminate as a whole is formed into one body (see FIG. 7B). The laminate further is heated to a curing temperature of the thermosetting resin contained in each of the sheet-like materials 33 and the electronic component built-in layers 32 so that the sheet-like materials 33, the electronic component built-in layers 32, and the conductive resin compositions 30 and 34 are cured completely. Thus, the circuit substrates 21, the sheet-like materials 33, the electronic component built-in layers 32, and the electronic components 24a and 24b are bonded firmly to each other, and electrical connections are made between the wiring patterns 27 by inner vias that are formed due to curing of the conductive resin compositions 30 and 34. The sheet-like materials 33 and the sheet-like materials 29 included in the electronic component built-in layers 32 correspond to the insulating layers 22 of the electronic component built-in module 2 (see FIG. 5).

The electronic component built-in module 2 with a multi-layer structure according to this embodiment is completed by the above-described process steps.

The embodiments of the present invention that are described as Embodiments 1 and 2 are not intended to limit the present invention thereto, and needless to say, the present invention can be embodied in other forms. In addition, in the electronic component built-in module according to the present invention, another electronic component can be mounted by various known methods on the wiring patterns on a surface of the circuit substrate placed on each main face of the electronic component built-in module.

EXAMPLES

Hereinafter, the present invention will be described in further detail by way of examples.

Examples 1 to 4, Comparative Examples 1 and 2

An electronic component built-in module according to each of Examples 1 to 4 and Comparative Examples 1 and 2 has the same configuration as that of the electronic component built-in module 1 (see FIG. 1 and FIGS. 4A and 4B) described with regard to Embodiment 1.

A sheet-like material 19 used for these examples and comparative examples was formed by the following method.

First, an inorganic filler and a liquid thermosetting resin were put in a container, and these materials in the container were subjected to mixing using an agitating and kneading machine. In each of these examples and comparative examples, as the inorganic filler, $Al_2O_3$ (in a spherical particle form, a mean particle diameter: 12 μm) was used in an amount of 90% by weight, and as the thermosetting resin, a liquid epoxy resin was used in an amount of 10% by weight. Moreover, methyl ethyl ketone for adjusting viscosity was added thereto. The respective compositions of the liquid epoxy resin in the amount of 10% by weight that were used for the examples and comparative examples are shown as follows:

Example 1: One-pack epoxy resin (6099 (manufactured by Asahi-Chiba Co., Ltd.)) 10% by weight Example 2: Epoxy resin (ME-268D (manufactured by Nippon Pelnox Corporation)) 6% by weight, Curing agent (Hv-110D (manufactured by Nippon Pelnox Corporation) 4% by weight Example 3: Epoxy resin (YL-6677 (manufactured by Yuka Shell Epoxy Co., Ltd.)) 7% by weight, Curing agent (YL-6065L (manufactured by Yuka Shell Epoxy Co., Ltd.)) 3% by weight Example 4: One-pack epoxy resin (ZC-104A (manufactured by Nippon Pelnox Corporation)) 10% by weight Comparative Example 1: One-pack epoxy resin (ZC-203 (manufactured by Nippon Pelnox Corporation)) 10% by weight Comparative Example 2: One-pack epoxy resin (ME-5890 (manufactured by Nippon Pelnox Corporation)) 10% by weight Using each of paste-like mixtures formed by weighing and mixing materials in the above-mentioned compositions, a film was formed by the doctor-blade method on a 75-μm thick polyethylene terephthalate film whose surface has been subjected to a mold release treatment with silicon. The polyethylene terephthalate film functions as a mold release carrier.

Next, the film of each of the above-mentioned mixtures thus formed was left standing at a temperature of 120° C. for 15 minutes and dried. Thus, using each of the above-mentioned mixtures, the uncured sheet-like material 19 that is 400 μm in thickness and does not have adhesion properties could be formed.

Next, the uncured sheet-like material 19 thus formed was cut into a predetermined size, and using a carbon gas laser, a through-hole having a diameter of 0.15 mm was formed at positions spaced at a uniform pitch of 0.2 mm to 2 mm. The through-hole was filled with a conductive resin composition 20 for filling an inner via by a screen printing method. The conductive resin composition 20 was formed by kneading using a three-roll mill, copper powder having a spherical particle form as a conductive material in an amount of 85% by weight, a bisphenol A type epoxy resin as a resin composition (EPICOAT 828 (manufactured by Yuka Shell Epoxy Co., Ltd.)) in an amount of 3% by weight, a glycidyl ester epoxy resin (YD-171 (manufactured by Tokyo Kasei Kogyo Co., Ltd.)) in an amount of 9% by weight, and an amine adduct curing agent (MY-24 (manufactured by Aginomoto Fine-Techno Co., Inc.)) in an amount of 3% by weight.

As each of circuit substrates 11, a printed wiring board (thickness: 200 μm) was used, in which an insulating base material 11a was formed from glass epoxy and three layers of wiring patterns were formed. A resistor, a capacitor, and an inductor were mounted by soldering on the printed wiring boards. Further, a gold bump was formed on a semiconductor bare chip, and flip-chip mounting of the semiconductor bare chip was performed. A portion between the semiconductor bare chip and the printed wiring board was encapsulated with an encapsulating resin.

Positioning of the sheet-like material 19 and the circuit substrates 11 that were formed in the above-described manner was performed so that each of electronic components mounted on the circuit substrates 11 was on a side of the sheet-like material 19, and then the sheet-like material 19 and the circuit substrates 11 were laminated. After that, using a hot press machine, a laminate thus obtained was subjected to heat at a pressing temperature of 120° C. and a pressure of 1 MPa for five minutes. By this heating, a resin composition in the sheet-like material 19 was melted and softened, so that the electronic components were embedded in the sheet-like material 19. A heating temperature further was raised, and the temperature was held at 180° C. for 60 minutes. By this heating, an epoxy resin in the sheet-like material 19 was cured, so that the electronic components and the circuit substrates 11 were bonded firmly to each other. Further, at the same time, the conductive resin composition 20 for filling an inner via was cured, and thus an inner via 13 was formed. Thus, an electrical connection was made between wiring patterns 17 formed on the different circuit substrates 11.

Examples 5 and 6, Comparative Example 3

An electronic component built-in module according to each of Examples 5 and 6 and Comparative Example 3 has the same configuration as that of the electronic component built-in module 2 (see FIG. 5, FIGS. 6A to 6C, and FIGS. 7A and 7B) described with regard to Embodiment 2.

Sheet-like materials 29 and 33 used for these examples and comparative example were formed by the same method as the method of forming the sheet-like material 19 used for Examples 1 to 4 and Comparative Examples 1 and 2. However, an epoxy resin used as a thermosetting resin was of the same type as that used in the case of Example 1. Further, in the sheet-like material 29, a through-hole formed at each predetermined position was filled with a conductive resin composition 30 for filling an inner via. The conductive resin composition 30 was formed by the same method as the method of forming the conductive resin composition 20 used for Examples 1 to 4 and Comparative Examples 1 and 2.

As a material of each of mold release carriers 31, a 70-μm thick electrolytic copper foil sheet was used. A thin peeling layer formed from chromium and chromate was formed on a surface of the electrolytic copper foil sheet, and a 9-μm thick copper layer was formed on the peeling layer by an electrolytic copper plating method. Chemical etching was performed with respect to the copper layer formed on the electrolytic copper foil sheet through the peeling layer so as to form predetermined wiring patterns 27.

Predetermined electronic components were mounted on the wiring patterns 27 on the mold release carriers 31 that were formed in this manner. As an active component, a semiconductor bare chip was used. A gold bump was formed on the semiconductor bare chip, and the semiconductor bare chip were mounted by flip-chip mounting on the wiring patterns 27. As passive components, a resistor, a capacitor, and an inductor were used and mounted using a conductive adhesive. Further, a portion between the semiconductor bare chip and the mold release carrier 31 was encapsulated with an encapsulating resin.

Positioning of each of the mold release carriers 31 with the electronic components mounted thereon that were formed in this manner was performed with respect to each main face of the sheet-like material 29 so that each of the electronic components was on a side of the sheet-like material 29, and then the mold release carriers 31 and the sheet-like material 29 were laminated. After that, using a hot press machine, a laminate thus obtained was subjected to heat at a pressing temperature of 120° C. and a pressure of 1 MPa for five minutes. By this heating, the thermosetting resin in the sheet-like material 29 was melted and softened, so that the electronic components and the wiring patterns were embedded in the sheet-like material 29. Later, only the mold release carriers 31 and the peeling layers were peeled off, and thus an electronic component built-in layer 32 was obtained.

As each of circuit substrates 21, a printed wiring board (thickness: 200 μm) was used, in which an insulating base material 21a was formed from glass epoxy and three layers of wiring patterns were formed. A resistor, a capacitor, and an inductor were mounted by soldering on the printed wiring boards. Further, a gold bump was formed on a semiconductor bare chip, and flip-chip mounting of the semiconductor bare chip was performed. A portion between the semiconductor bare chip and the printed wiring board was encapsulated with an encapsulating resin. In Examples 5 and 6 and Comparative Example 3, the following printed wiring boards were used, respectively.

Example 5: Glass epoxy printed wiring board (R-1776 (manufactured by Matsushita Electric Works, Ltd.))

Example 6: Glass epoxy printed wiring board (R-1566 (manufactured by Matsushita Electric Works, Ltd.))

Comparative Example 3: Glass epoxy printed wiring board (R-1776T (manufactured by Matsushita Electric Works, Ltd.))

Two electronic component built-in layers 32 and two circuit substrates 21 that were formed respectively in the above-mentioned manners and two sheet-like materials 33 that were formed separately were prepared. The electronic component built-in layers 32 and the sheet-like materials 33 were placed between the two circuit substrates 21. Positioning was performed so that the circuit substrates 21 were in contact with the sheet-like materials 33 and each of the electronic components mounted on the circuit substrates 21 was on a side of each of the sheet-like materials 33, and then the electronic component built-in layers 32, the circuit substrates 21, and the sheet-like materials 33 were laminated. After that, using a hot press machine, a laminate thus obtained was subjected to heat at a pressing temperature of 120° C. and a pressure of 1 MPa for five minutes. By this heating, a resin composition in each of the sheet-like materials 33 was melted and softened, so that the electronic components on the circuit substrates 21 were embedded in the sheet-like materials 33. A heating temperature further was raised, and the temperature was held at 180° C. for 60 minutes. By this heating, the epoxy resin in each of the electronic component built-in layers 32 and the sheet-like materials 33 was cured, so that the electronic components and the circuit substrates 21 were bonded firmly to each other. Further, at the same time, the conductive resin composition 30 for filling an inner via was cured, and thus an inner via 23 was formed. Thus, an electrical connection was made between the wiring patterns 27 formed on different layers.

The electronic component built-in modules according to Examples 1 to 6 and Comparative Examples 1 to 3 were manufactured in the above-described manner.

Table 1 shows a glass transition temperature Tg1 of an insulating layer and a glass transition temperature Tg2 of the circuit substrate with respect to each of Examples 1 to 6 and Comparative Examples 1 to 3. As for the insulating layer, the sheet-like material in the form of a cured body was formed by hot pressing, and a glass transition temperature thereof was determined and used as the glass transition temperature Tg1 of the insulating layer. Specifically, an uncured sheet-like material was interposed between copper foil sheets, and a laminate thus obtained was held at a pressing temperature of 200° C. under a pressure of 1 MPa for two hours so as to be cured. Then, the copper foil sheets were peeled off, and thus a cured body was obtained. The glass transition temperatures were determined according to both of a TMA method and a DMA method that are specified in "Method of testing a copper-clad laminate for a printed wiring board" of JIS-C6481. In the TMA method, with respect to each sample, while a load was applied, a temperature was raised from room temperature at a rate of 10° C. per minute so that a temperature-deformation curve was obtained. On the curve, an intersection point of two straight lines defined by the curve was used to determine a glass transition temperature Tg. The determination was performed using a TMA apparatus (TMA/SS150C (manufactured by Seiko Instruments Inc.)). In the DMA method, with respect to each sample, dynamic viscoelasticity was determined by applying a sinusoidal tensile stress of 10 Hz, and the temperature dependence thereof was determined by raising a temperature from room temperature at a rate of 5° C. per minute. A peak temperature of a loss tangent was used to define a glass transition temperature Tg. The determination was performed using a DMA apparatus (DMS210 (manufactured by Seiko Instruments Inc.)). Generally, the DMA method provides a glass transition temperature Tg higher by about 20° C. than a glass transition temperature Tg determined according to the TMA method.

Moreover, the results of reliability evaluation obtained by reflow resistance tests also are shown in Table 1. The reliability evaluation was performed using a belt-type reflow furnace in the following manner. That is, reflow resistance tests in which each sample was passed through the reflow furnace three times were performed. The reflow furnace had a temperature history such that a temperature was held at 260° C. as the highest temperature for 30 seconds. After the tests, an electrical resistance value of an inner via was measured so as to determine an amount of change in resistance, and an amount of change in resistance not more than 10% with respect to an electrical resistance value obtained before the tests was regarded as acceptable. Table 1 shows acceptance ratios obtained in the case where for each of the examples and comparative examples, 20 samples of the electronic component built-in module were prepared, and the reliability evaluation was performed with respect thereto. For the evaluation of an electrical resistance of an inner via, a chain pattern formed by coupling 80 inner vias by wiring patterns is formed in each of the samples.

TABLE 1

| | Glass transition temperature (° C.) | | | | Reliability evaluation Acceptance ratio (%) |
| | DMA Method | | TMA method | | |
| --- | --- | --- | --- | --- | --- |
| | Insulating layer (Tg1) | Circuit substrate (Tg2) | Insulating layer (Tg1) | Circuit substrate (Tg2) | |
| Example 1 | 180 | 170 | 161 | 151 | 100 |
| Example 2 | 195 | 170 | 172 | 151 | 100 |
| Example 3 | 220 | 170 | 199 | 151 | 100 |
| Example 4 | 175 | 170 | 157 | 151 | 95 |
| Example 5 | 180 | 150 | 162 | 129 | 100 |
| Example 6 | 180 | 170 | 162 | 151 | 100 |
| Com. Ex. 1 | 135 | 170 | 121 | 151 | 0 |
| Com. Ex. 2 | 155 | 170 | 139 | 151 | 0 |
| Com. Ex. 3 | 180 | 200 | 162 | 183 | 0 |

After performing the reflow resistance test three times, no cracks were observed in any of the samples. Further, also in observations with an ultrasonic flaw detector, no cracks were observed in the electronic components that were housed. Meanwhile, as for the results of the reliability evaluation regarding an inner via, as shown in Table 1, in any of Comparative Examples 1 to 3, no samples were obtained as acceptable products, while in each of Examples 1 to 6 where Tg1>Tg2 was satisfied, excellent reliability was obtained. Particularly, in each of Examples 1 to 3, 5 and 6 where a difference between the glass transition temperatures Tg1 and Tg2 was not less than 10° C., no defective products were obtained.

Figure 8:
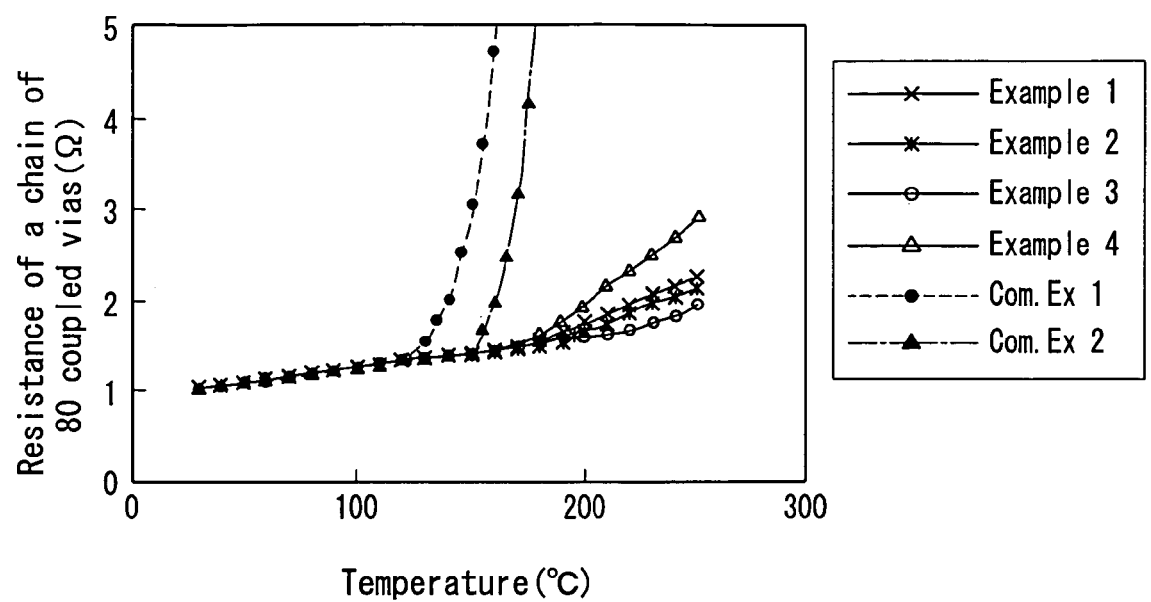
FIG. 8 is a diagram showing a relationship between a temperature and a resistance value of a chain pattern with respect to each of electronic component built-in modules according to Examples 1 to 4 and Comparative Examples 1 and 2.
Figure 9:
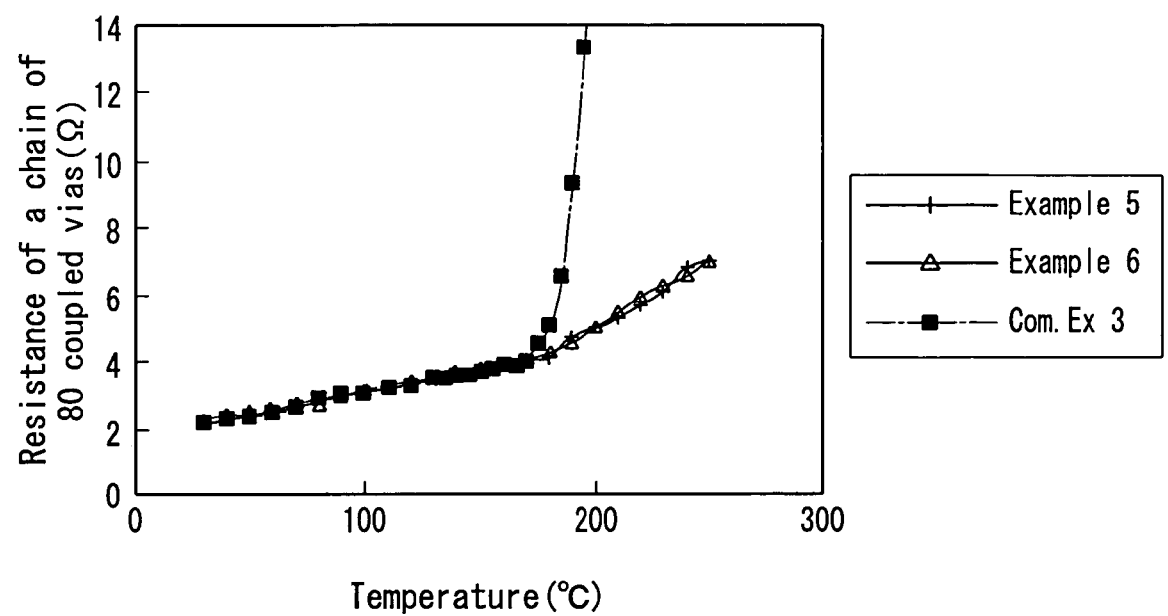
FIG. 9 is a diagram showing a relationship between a temperature and a resistance value of a chain pattern with respect to each of electronic component built-in modules according to Examples 5 and 6 and Comparative Example 3.
Figure 10:
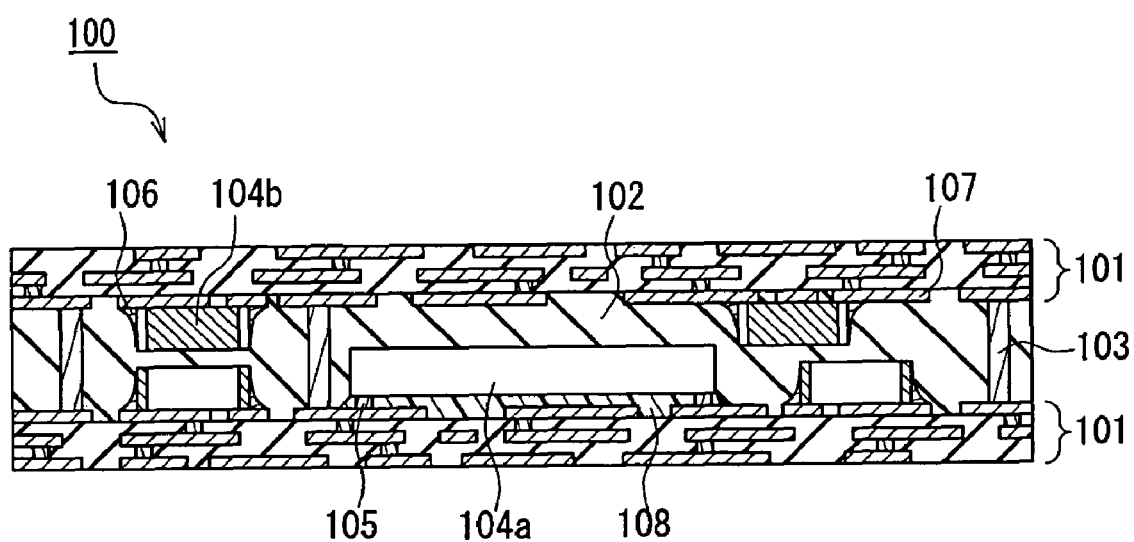
FIG. 10 is a cross sectional view showing a configuration of a conventional electronic component built-in module.

Furthermore, with respect to each of samples prepared separately from the samples used for the reflow resistance tests, a resistance value (including a wiring resistance) of a chain pattern when the temperature of the sample was raised from room temperature (30° C.) to 250° C. at a rate of 5° C. per minute was measured. FIG. 8 shows a relationship between a temperature and a resistance value of a chain pattern (resistance of a chain of 80 coupled vias) with respect to each of Examples 1 to 4 and Comparative Examples 1 and 2. FIG. 9 shows a relationship between a temperature and a resistance value of a chain of 80 coupled vias with respect to each of Examples 5 and 6 and Comparative Example 3. According to FIGS. 8 and 9, the following can be confirmed. That is, each of Comparative Examples 1 to 3 exhibits a steep increase in the resistance of a chain of 80 coupled vias when a temperature rises from a temperature around the glass transition temperature Tg1 of the insulating layer. On the other hand, each of Examples 1 to 6 exhibits a small change in the resistance of a chain of 80 coupled vias with respect to a temperature rise. Conceivably, this is based on the following reason. That is, since the glass transition temperature Tg1 of the resin composition contained in the insulating layer was higher than the glass transition temperature Tg2 of the insulating base material of each of the circuit substrates interposing the insulating layer, a phenomenon could be suppressed, in which elongation of the insulating layer to a plane direction due to thermal expansion was restricted by the circuit substrates. Because of this, abrupt thermal expansion of the insulating layer in a thickness direction became less likely. In other words, it was confirmed that an excessively large tensile stress became less likely to be generated in a length direction of the inner via formed in the insulating layer, thereby allowing improved connection reliability to be obtained. However, in Example 4, due to a small difference between the glass transition temperatures Tg1 and Tg2, it was observed that a slight increase in resistance was caused as a temperature rose. This result also confirmed that preferably, a difference between the glass transition temperatures Tg1 and Tg2 was not less than 10° C.

As described above by way of Embodiments and Examples of the present invention, the electronic component built-in module and the method of manufacturing the same according to the present invention can provide an electronic component built-in module that achieves high reliability of an inner via.

The specific embodiments or examples disclosed under DETAILED DESCRIPTION OF THE INVENTION are intended to illustrate the technical aspects of the invention and not to limit the invention thereto. The invention is not to be construed narrowly and may be embodied in other forms without departing from the spirit and the scope of the invention as indicated by the appended claims.

What is claimed is:

1. An electronic component built-in module, comprising:
a pair of opposed circuit substrates, in each of which a wiring pattern is formed on an insulating base material containing a resin;
an insulating layer that is placed between the pair of circuit substrates and contains an inorganic filler and a resin composition containing a thermosetting resin;
at least one electronic component that is embedded in the insulating layer; and
an inner via that is provided in the insulating layer so as to make an electrical connection between wiring patterns provided on different circuit substrates,
wherein a glass transition temperature Tg1 of the resin composition contained in the insulating layer and a glass transition temperature Tg2 of the resin of the insulating base material included in each of the circuit substrates satisfy a relationship Tg1>Tg2,
wherein a difference between the glass transition temperature Tg1 and the glass transition temperature Tg2 is at least 10° C., and wherein a rate of increase in amount of thermal expansion in a thickness direction of the insulating layer at a temperature from Tg2 to Tg1 is smaller than a rate of increase in amount of thermal expansion in a thickness direction of the insulating layer at a temperature higher than Tg1.

2. The electronic component built-in module according to claim 1,
wherein a plurality of the insulating layers are provided.

3. The electronic component built-in module according to claim 1,
wherein the insulating layer contains the inorganic filler in an amount of not less than 70% by weight and not more than 95% by weight.

4. The electronic component built-in module according to claim 1,
wherein the inorganic filler contains at least one selected from the group consisting of: $Al_2O_3$, MgO, BN, $SiO_2$, SiC, $Si_3N_4$, and AlN.

5. The electronic component built-in module according to claim 1,
wherein the thermosetting resin contains at least one selected from the group consisting of: an epoxy resin, a phenol resin, and an isocyanate resin.

6. The electronic component built-in module according to claim 1,
wherein the at least one electronic component comprises a semiconductor bare chip.

7. The electronic component built-in module according to claim 1,
wherein the inner via is formed from a conductive resin composition.

8. The electronic component built-in module according to claim 1,
wherein the at least one electronic component embedded in the insulating layer is mounted on at least one of the pair of opposed circuit substrates.

9. The electronic component built-in module according to claim 1,
wherein at least one electronic component is mounted on each of the pair of circuit substrates, the circuit substrates being placed so that surfaces of the circuit substrates on which the electronic components are mounted face each other, the electronic components being housed in the insulating layer.

10. The electronic component built-in module according to claim 1,
wherein no electronic component is housed in the circuit substrates.

11. A method of manufacturing an electronic component built-in module, comprising the steps of:
(a) preparing at least two circuit substrates, in each of which a wiring pattern is formed on an insulating base material that contains a resin and has a glass transition temperature Tg2, and mounting at least one electronic component on at least one of the circuit substrates;
(b) forming a sheet-like material in which a through-hole is formed in a predetermined region, using a mixture containing an inorganic filler and an uncured resin composition that contains at least a thermosetting resin and has a glass transition temperature Tg1;
(c) filling the through-hole with a conductive resin composition;
(d) placing the sheet-like material between the circuit substrates so that a face of each of the at least one of the circuit substrates, on which the at least one electronic component is mounted, is directed to a side of the sheet-like material, and embedding the at least one electronic component inside the sheet-like material by applying pressure in a thickness direction so that the sheet-like material and the circuit substrates are formed into one body; and
(e) forming an insulating layer by allowing the thermosetting resin contained in the sheet-like material to be cured,
wherein the glass transition temperature Tg1 and the glass transition temperature Tg2 satisfy a relationship Tg1>Tg2, and
wherein a difference between the glass transition temperature Tg1 and the glass transition temperature Tg2 is at least 10° C. and
wherein a rate of increase in amount of thermal expansion in a thickness direction of the insulating layer at a temperature from Tg2 to Tg1 is smaller than a rate of increase in amount of thermal expansion in a thickness direction of the insulating layer at a temperature higher than Tg1.

12. The method according to claim 11,
wherein in the step (d), an electronic component built-in layer, in which at least one electronic component is embedded in an insulating member containing a resin composition having the glass transition temperature Tg1, further is placed between the circuit substrates, and pressure is applied in the thickness direction.

13. The method according to claim 11,
wherein in the step (d), at least two sheet-like materials, and an electronic component built-in layer in which at least one electronic component is embedded in an insulating member containing a resin composition having the glass transition temperature Tg1, are placed between the circuit substrates so that the sheet-like materials are in contact with the circuit substrates, and pressure is applied in the thickness direction.

14. The method according to claim 12,
wherein a method of manufacturing the electronic component built-in layer comprises the steps of:
forming a wiring pattern on one face of a mold release carrier, and further mounting at least one electronic component thereon;
forming a sheet-like material in which a through-hole is formed in a predetermined region, using a mixture containing an inorganic filler and an uncured resin composition that contains at least a thermosetting resin and has the glass transition temperature Tg1;
filling the through-hole with a conductive resin composition;
laminating the mold release carrier on the sheet-like material so that the one face of the mold release carrier, on which the at least one electronic component is mounted, is directed to a side of the sheet-like material, and embedding the at least one electronic component inside the sheet-like material by applying pressure in a lamination direction; and
peeling the mold release carrier from the sheet-like material.

15. The method according to claim 13,
wherein a method of manufacturing the electronic component built-in layer comprises the steps of:
forming a wiring pattern on one face of a mold release carrier, and further mounting at least one electronic component thereon;
forming a sheet-like material in which a through-hole is formed in a predetermined region, using a mixture containing an inorganic filler and an uncured resin composition that contains at least a thermosetting resin and has the glass transition temperature Tg1;

filling the through-hole with a conductive resin composition;

laminating the mold release carrier on the sheet-like material so that the one face of the mold release carrier, on which the at least one electronic component is mounted, is directed to a side of the sheet-like material, and embedding the at least one electronic component inside the sheet-like material by applying pressure in a lamination direction; and peeling the mold release carrier from the sheet-like material.

* * * * *